(12) United States Patent
Pan et al.

(10) Patent No.: US 8,710,517 B2
(45) Date of Patent: Apr. 29, 2014

(54) HIGH-VOLTAGE AC LIGHT-EMITTING DIODE STRUCTURE

(75) Inventors: Ching-Jen Pan, Hsinchu County (TW); Wei-Tai Cheng, Hsinchu County (TW); Ming-Hung Chen, Hsinchu County (TW)

(73) Assignee: Helio Optoelectronics Corporation, Hsinchu County (TW)

( * ) Notice: Subject to any disclaimer, the term of this patent is extended or adjusted under 35 U.S.C. 154(b) by 297 days.

(21) Appl. No.: 13/407,028

(22) Filed: Feb. 28, 2012

(65) Prior Publication Data

US 2013/0126914 A1    May 23, 2013

(30) Foreign Application Priority Data

Nov. 17, 2011  (TW) .............................. 100142107 A

(51) Int. Cl.
*H01L 27/15* (2006.01)
(52) U.S. Cl.
USPC .................. 257/88; 257/93; 257/E27.121

(58) Field of Classification Search
USPC ...................... 257/88, 94, E27.121, E33.005; 362/252, 545, 800
See application file for complete search history.

(56) References Cited

U.S. PATENT DOCUMENTS

| 6,853,011 B2* | 2/2005 | Lin ................................. 257/99 |
| 6,957,899 B2* | 10/2005 | Jiang et al. ...................... 362/84 |
| 6,998,642 B2 | 2/2006 | Lin et al. |

* cited by examiner

*Primary Examiner* — Roy Potter
(74) *Attorney, Agent, or Firm* — Morris, Manning & Martin LLP; Juan Carlos A. Marquez

(57) ABSTRACT

A high-voltage alternating current (AC) light-emitting diode (LED) structure is provided. The high-voltage AC LED structure includes a circuit substrate and a plurality of high-voltage LED (HV LED) chips. Each one of the HV LED chips includes a first substrate, an adhering layer, first ohmic contact layers, epi-layers, a first insulating layer, at least two first electrically conducting plates, at least two second electrically conducting plates, and a second substrate. The HV LED chips manufactured by a wafer-level process are coupled to the low-cost circuit substrate to produce the downsized high-voltage AC LED structure.

19 Claims, 16 Drawing Sheets

301、302

301、302

301、302

HIGH-VOLTAGE AC LIGHT-EMITTING DIODE STRUCTURE

BACKGROUND OF THE INVENTION

1. Technical Field

The present invention relates to high-voltage alternating current (AC) light-emitting diode (LED) structures, and more particularly, to a high-voltage AC LED structure for use in illumination.

2. Description of Related Art

U.S. Pat. No. 6,853,011 has disclosed a light emitting epi-layer structure containing a temporary substrate of absorption light type on one side, while the other side thereof is then adhered to a transparent substrate of light absorption free by benzocyclobutene (BCB) bonding layer. After that, the light absorption temporary substrate portion is removed. The resulted light emitting structure is then patterned to form a connection channel to connect the first ohmic contact electrode and form an isolation trench to separate the active layer of the light emitting structure into two parts. Thereafter, a second ohmic contact electrode on the cladding layer and a bonding metal layer filled in the first channel and on second ohmic contact electrode are successively formed. The resulted LED structure is hence convenient for flip-chip package structure since two bonding metal layers have the same altitude.

U.S. Pat. No. 6,998,642 has disclosed a semiconductor structure with two light emitting diodes in series connection. The semiconductor structure comprises two light emitting diodes (LEDs) having the same stack layers and abutting each other but spaced by an isolation trench. The stack layers from a bottom thereof include a thermal conductive substrate, an nonconductive protective layer, a metal adhering layer, a mirror protective layer, a p-type ohmic contact epi-layer, a upper cladding layer, an active layer, and a lower cladding layer. Two p-type ohmic contact metal electrodes for two LEDs are formed on an interface between the mirror protective layer and the ohmic contact epi-layer and buried in the mirror protective layer.

Although the LED structure of U.S. Pat. No. 6,853,011 is applicable to flip-chip package structures, not only is the connection between the two light emitting diodes impossible to be accomplished in the absence of a submount, but the flip-chip process entails processing multiple chips and therefore adds to the complexity of the process. Although U.S. Pat. No. 6,998,642 is effective in electrically connecting two light emitting diodes, metal-based bonding can only be performed by a complicated process to thereby compromise production performance and incur costs.

Light-emitting diodes are manufactured mostly by a non-wafer-level process according to the aforesaid prior art without taking account of users' need for coupling multiple light-emitting diodes together by series connection, parallel connection, or parallel-series connection. Accordingly, it is imperative to manufacture a high-voltage alternating current (AC) light-emitting diode simply and conveniently.

SUMMARY OF THE INVENTION

The present invention provides a high-voltage alternating current (AC) light-emitting diode (LED) structure comprising a circuit substrate, and a plurality of high-voltage LED chips. The high-voltage LED chips each comprise a first substrate, an adhering layer, first ohmic contact layers, epi-layers, a first insulating layer, at least two first electrically conducting plates, at least two second electrically conducting plates, and a second substrate. According to the present invention, high-voltage LED chips manufactured by a wafer-level process are coupled to a low-priced circuit substrate, so as to produce the downsized high-voltage AC LED structure.

The present invention provides a high-voltage alternating current (AC) light-emitting diode (LED) structure, comprising: a circuit substrate; and a plurality of high-voltage LED chips fixed to and electrically connected to the circuit substrate and forming a series-connected circuit by means of the circuit substrate, the high-voltage LED chips each comprising: a first substrate having a first surface and a second surface; an adhering layer formed on the first surface; at least two first ohmic contact layers formed on the adhering layer; at least two epi-layers having a first groove formed between any two adjacent said epi-layers, the epi-layers each comprising: a lower cladding layer formed on a corresponding one of the first ohmic contact layers; an active layer formed on the lower cladding layers; and an upper cladding layer formed on the active layer; a first insulating layer covering exposed surfaces of each of the first ohmic contact layers and exposed surfaces of each of the upper cladding layers, and forming between any two of the first ohmic contact layers, wherein a first opening and a second opening corresponding in position to each of the upper cladding layers and a bare portion of each of the first ohmic contact layers, respectively, are formed in the first insulating layer; at least two first electrically conducting plates each formed inside a corresponding one of the first openings and electrically connected to a corresponding one of the upper cladding layers; at least two second electrically conducting plates each formed inside a corresponding one of the second openings and electrically connected to a corresponding one of the first ohmic contact layers; and a second substrate having a third surface, wherein at least two third electrically conductive plates and at least two fourth electrically conductive plates are formed on the third surface, the second substrate having a plurality of traces formed thereon for electrically connecting the third electrically conductive plates and the fourth electrically conductive plates, wherein each of the third electrically conductive plates and each of the fourth electrically conductive plates are electrically connected to a corresponding one of the second electrically conducting plates and/or a corresponding one of the first electrically conducting plates, respectively, by a solder joint, the first substrate being transparent, the adhering layer being transparent, and wherein a reflective layer is formed on the third surface in a manner that the reflective layer thus formed is positioned outside the third electrically conductive plates and the fourth electrically conductive plates.

The present invention also provides a high-voltage alternating current (AC) light-emitting diode (LED) structure, comprising: a circuit substrate; and a plurality of high-voltage LED chips fixed to and electrically connected to the circuit substrate and forming a series-connected circuit by means of the circuit substrate, the high-voltage LED chips each comprising: a first substrate having a first surface and a second surface; an adhering layer formed on the first surface; at least two first ohmic contact layers formed on the adhering layer; at least two epi-layers each comprising: a lower cladding layer formed on a corresponding one of the first ohmic contact layers; an active layer formed on the lower cladding layers; an upper cladding layer formed on the active layer; and a second groove penetrating the upper cladding layers and the active layer perpendicularly and penetrating the lower cladding layers partially; a second insulating layer covering each of the upper cladding layers and forming between any two of the epi-layers and any two of the first ohmic contact layers, wherein a third opening and a fourth opening corresponding in position to each of the upper cladding layers and an inner side of the second groove, respectively, are formed in the second insulating layer; at least two fifth electrically conductive plates formed in each of the third openings, respectively, and electrically connected to the upper cladding layers; and at least two sixth electrically conductive plates formed in each of the fourth openings, respectively, and having an extension portion extending downward, the extension portion penetrating the epi-layers perpendicularly and being electrically connected to the first ohmic contact layers.

Implementation of the present invention at least involves inventive steps as follows:

1. HV LED chips manufactured by a wafer-level process are coupled to a low-cost circuit substrate to produce a downsized high-voltage AC LED structure.

2. A high-voltage AC LED structure is produced easily and quickly.

3. High-voltage AC LED structures that manifest diversity can be produced.

The detailed features and advantages of the present invention will be described in detail with reference to the preferred embodiment so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

DETAILED DESCRIPTION OF THE EMBODIMENTS OF THE INVENTION

Figure 1A:
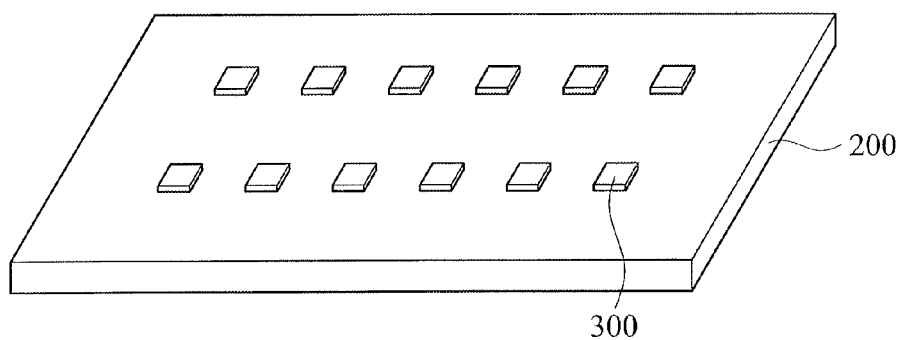
FIG. 1A is a schematic view of a high-voltage alternating current (AC) light-emitting diode (LED) structure according to an embodiment of the present invention.

Referring to FIG. 1A, in this embodiment, a high-voltage AC LED structure 100 comprises a circuit substrate 200 and a plurality of high-voltage LED chips 300. The present invention provides two types of high-voltage LED chips 300, namely a high-voltage LED chip 301 and a high-voltage LED chip 302 in their respective embodiments.

The circuit substrate 200 is an aluminum substrate or a ceramic substrate. In an embodiment where the high-voltage LED chips 300 are coupled to the circuit substrate 200, the volume of the circuit substrate 200 is much larger than that of the high-voltage LED chips 300; hence, it is feasible to allow the circuit substrate 200 to provide electrical connection for the high-voltage LED chips 300 and thereby design a diversified parallel-series connected circuit, so as to produce the high-voltage AC LED structure 100 easily, quickly, and diversely.

In addition to circuit connection, the circuit substrate 200 enables heat dissipation. In an embodiment where the circuit substrate 200 is a ceramic substrate, a plurality of thermally conductive posts or a plurality of electrically conductive posts can be disposed inside the ceramic substrate for transferring efficiently the heat generated by the high-voltage LED chips 300 in operation and enabling an electrode of the high-voltage LED chips 300 to extend to the other side of the ceramic substrate smoothly.

Figure 1B:
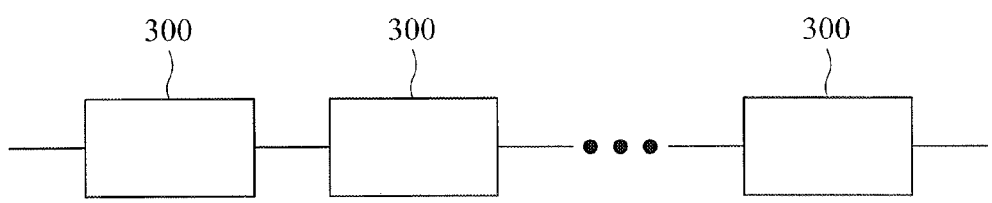
FIG. 1B is a series-connected equivalent circuit diagram according to an embodiment of the present invention.

Referring to FIG. 1B, a plurality of high-voltage LED chips 300 is fixed to and electrically connected to the circuit substrate 200. The high-voltage LED chips 300 form a series-connected circuit 400 by means of the diverse electrical connection provided by the circuit substrate 200. In an embodiment where the high-voltage LED chips 300 are driven by an alternating current (AC), the high-voltage LED chips 300 are applicable to the high-voltage AC LED structure 100. This is the basic aspect of the series-connected circuit 400 in this embodiment.

Figure 2A:
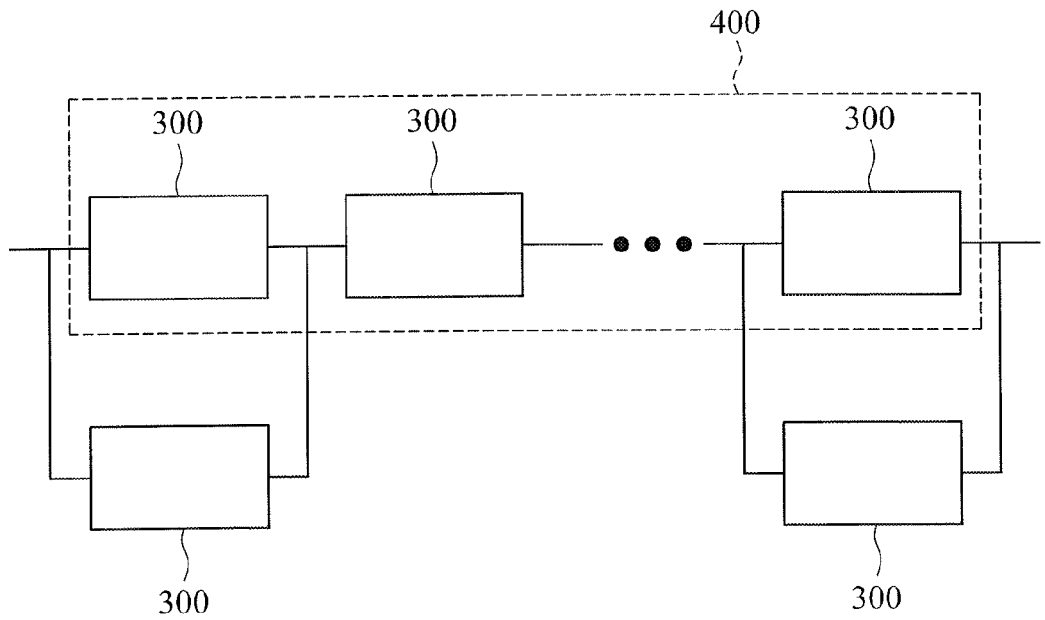
FIG. 2A is a parallel-series connected equivalent circuit in first aspect according to an embodiment of the present invention.
Figure 2B:
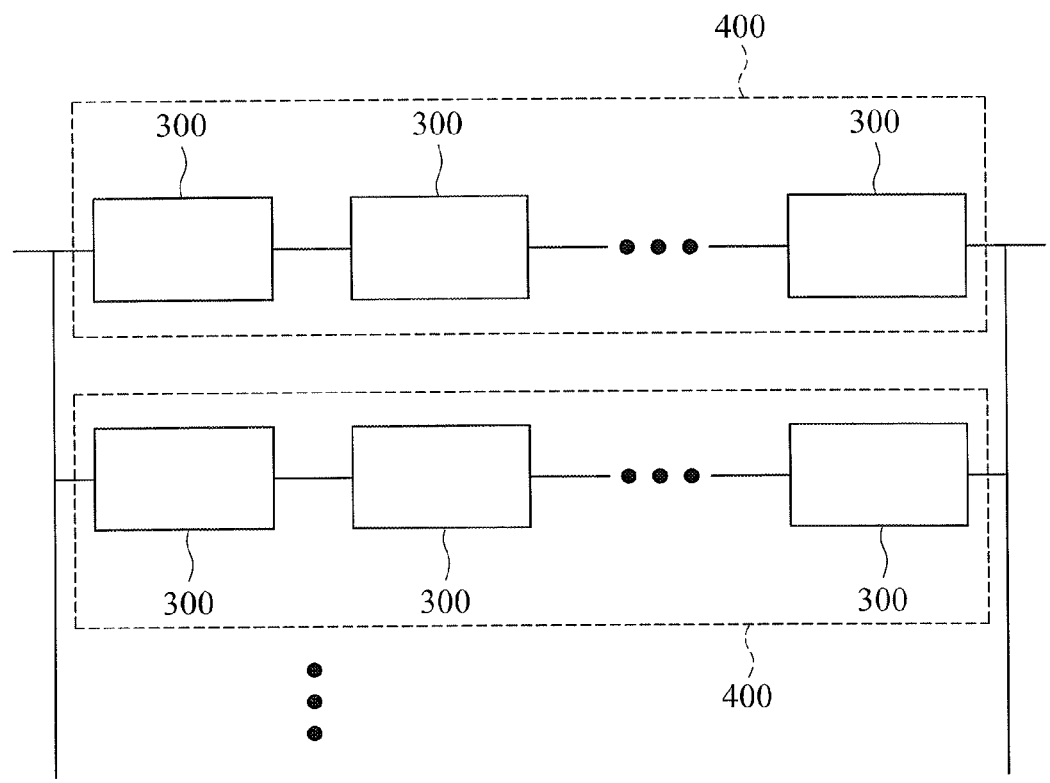
FIG. 2B is a parallel-series connected equivalent circuit in second aspect according to an embodiment of the present invention.

Referring to FIG. 2A and FIG. 2B, in addition to the aforesaid basic aspect, it is feasible to connect any two of the high-voltage LED chips 300 in parallel, such that the series-connected circuit 400 further comprises at least one parallel-connected circuit, or it is feasible for the series-connected circuit 400 to be further parallel-connected with at least one said series-connected circuit 400, so as to form a high-voltage AC circuit characterized by diversity.

The structure of the high-voltage LED chips 300 is described below. In the embodiments below, the structure of each layer of the high-voltage LED chips 300 is manufactured by a conventional semiconductor fabrication process and thus is not described hereunder in detail for the sake of brevity. To circumvent a lengthy description, a term, such as "etching process" or "etching means", is defined as a simplified one that refers to a lithography process in its entirety. Also, the high-voltage LED chips 300 can form a multi-dimensional array and thus are not restricted to the quantity disclosed in the embodiments below.

First Embodiment of High-voltage LED Chips

A typical fabrication process of the high-voltage LED chips 300 is performed by a semiconductor process which entails forming on a wafer the preprocessing high-voltage LED chips which have not yet been treated with singulation and provided with any other insulating layer and electrically conductive plate. However, before the high-voltage LED chips 300 are put into use, the wafer has to be removed. It is because the wafer is undesirably thick, opaque, and thus unusable. Hence, the wafer is just a temporary substrate during a process of manufacturing the high-voltage LED chips 300.

In general, among the methods of removing a temporary substrate, an etching means is in widest use. To protect the high-voltage LED chips 300 from damage which might otherwise occur during an etching process because of excessive etching, it is necessary to provide an etch stop layer. During the wafer etching process, most of the etch stop layer is also etched; hence, the etch stop layer serves to protect the high-voltage LED chips 300. Upon completion of the aforesaid process, the preprocessing high-voltage LED chips are finalized. Referring to FIG. 3 through FIG. 7B, in this embodiment, a high-voltage LED chip 301 comprises a first substrate 21, an adhering layer 22, at least two first ohmic contact layers 23, at least two epi-layers 24, a first insulating layer 25, at least two first electrically conducting plates 26, and at least two second electrically conducting plates 27.

The first substrate 21 has a first surface 211 and a second surface 212. The first substrate 21 serves mainly to underpin the high-voltage LED chip 301 in its entirety. The first substrate 21 is mono crystalline, polycrystalline, or amorphous, and is made of glass, sapphire, silicon carbide (SiC), gallium phosphide (GaP), gallium arsenide phosphide (GaAsP), zinc selenide (ZnSe), zinc sulfide (ZnS), or americium sulfur selenide (AmSSe). The first substrate 21 can be transparent or opaque, depending on the direction of light emission of the high-voltage LED chip 301 or the design of a reflective layer. In an embodiment where guided bidirectional (upward/downward) light emission is required, the first substrate 21 has to be transparent.

The adhering layer 22 is formed on the first surface 211 and adapted to couple the first substrate 21 and the first ohmic contact layer 23 together. The adhering layer 22 is made of a material selected from B-staged benzocyclobutene (BCB), an epoxy, a silicone, polymethyl methacry (PMMA), a polymer, and a spin-on glass (SOG). The adhering layer 22 can be transparent or opaque, depending on the direction of light emission of the high-voltage LED chip 301 or the design of a reflective layer. In an embodiment where guided bidirectional (upward/downward) light emission is required, the adhering layer 22 has to be transparent.

Figure 3:
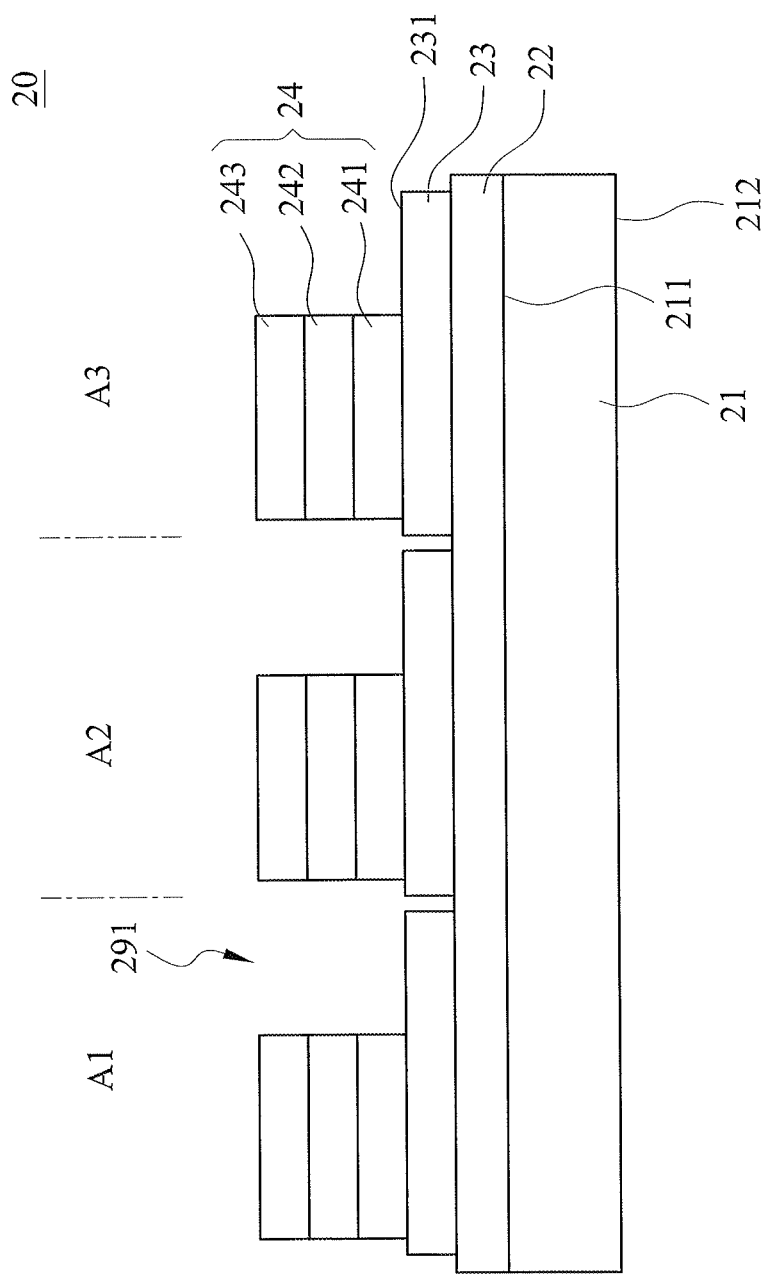
FIG. 3 is a cross-sectional view of a singulated high-voltage LED chip according to an embodiment of the present invention.

Referring to FIG. 3, a light-emitting diode 28 comprises the first ohmic contact layer 23 and the epi-layer 24, and both of which are disposed on the first substrate 21 and the adhering layer 22. Hence, singulation is performed on the first ohmic contact layer 23 and the epi-layer 24 only, so as to form units A1, A2, A3 . . . etc.

Figure 4A:
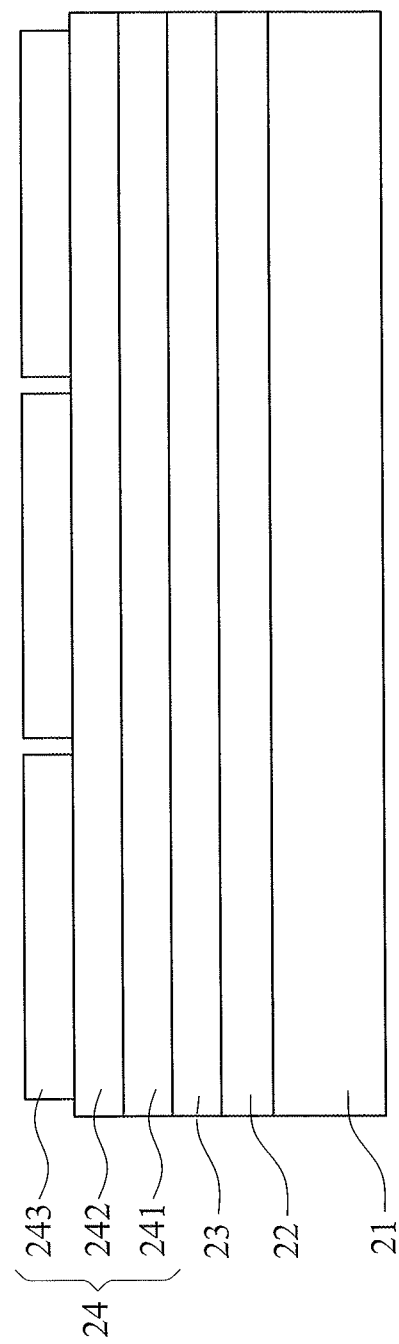
FIG. 4A is a schematic view of a manufacturing method prior to the first etching process of FIG. 3.

Referring to FIG. 4A, the first ohmic contact layer 23 is formed on the adhering layer 22. The first ohmic contact layer 23, which can be a p-type ohmic contact layer, is formed on a wafer initially and partitioned by an etching means to form different units.

Referring to FIG. 3, the epi-layer 24, which is a single light-emitting diode 28, is partitioned by etching to form different units. A first groove 291 is formed in the epi-layer 24 by an etching process. Due to the formation of the first groove 291, the first ohmic contact layer 23 has a bare portion 231 formed thereon for exposing the first ohmic contact layer 23 partially and thereby facilitating the positioning of the second electrically conducting plates 27. The second electrically conducting plates 27 positioned in place enable the series/parallel connection of the light-emitting diodes 28 of different units, thereby rending it easy to finalize the high-voltage light-emitting diodes 28.

Figure 4B:
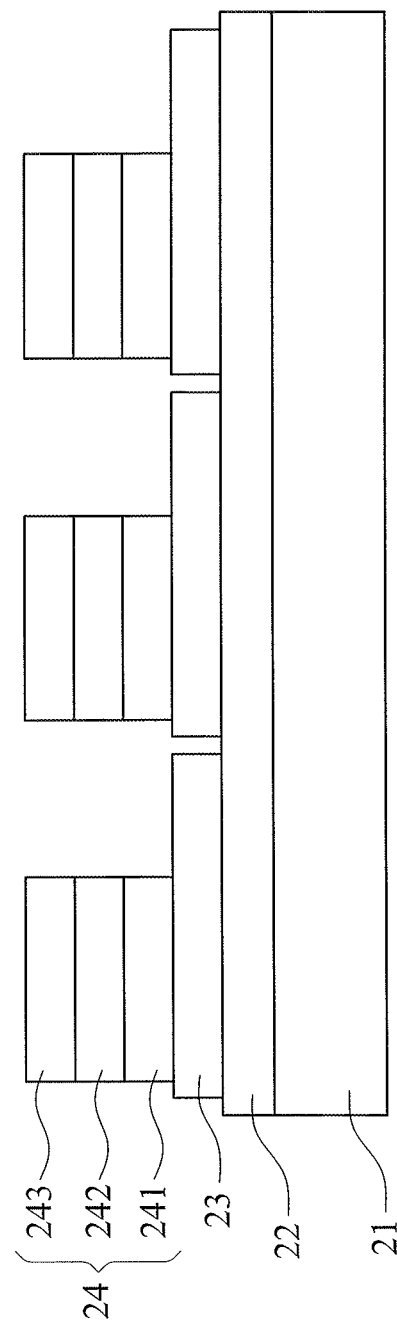
FIG. 4B is a schematic view of a manufacturing method of the second etching process performed after completion of the first etching process of FIG. 4A.

Referring to FIG. 3, FIG. 4A, and FIG. 4B, singulation of the first ohmic contact layer 23 and production of the first groove 291 are accomplished in different etching steps, respectively. Among the numerous etching steps, the first etching involves etching a notch corresponding in position to and having the same size as the space between two adjacent said first ohmic contact layers 23, whereas the second etching follows the first etching and etches the size of the first groove 291. The aforesaid two etching steps render the process simple and convenient.

Figure 5:
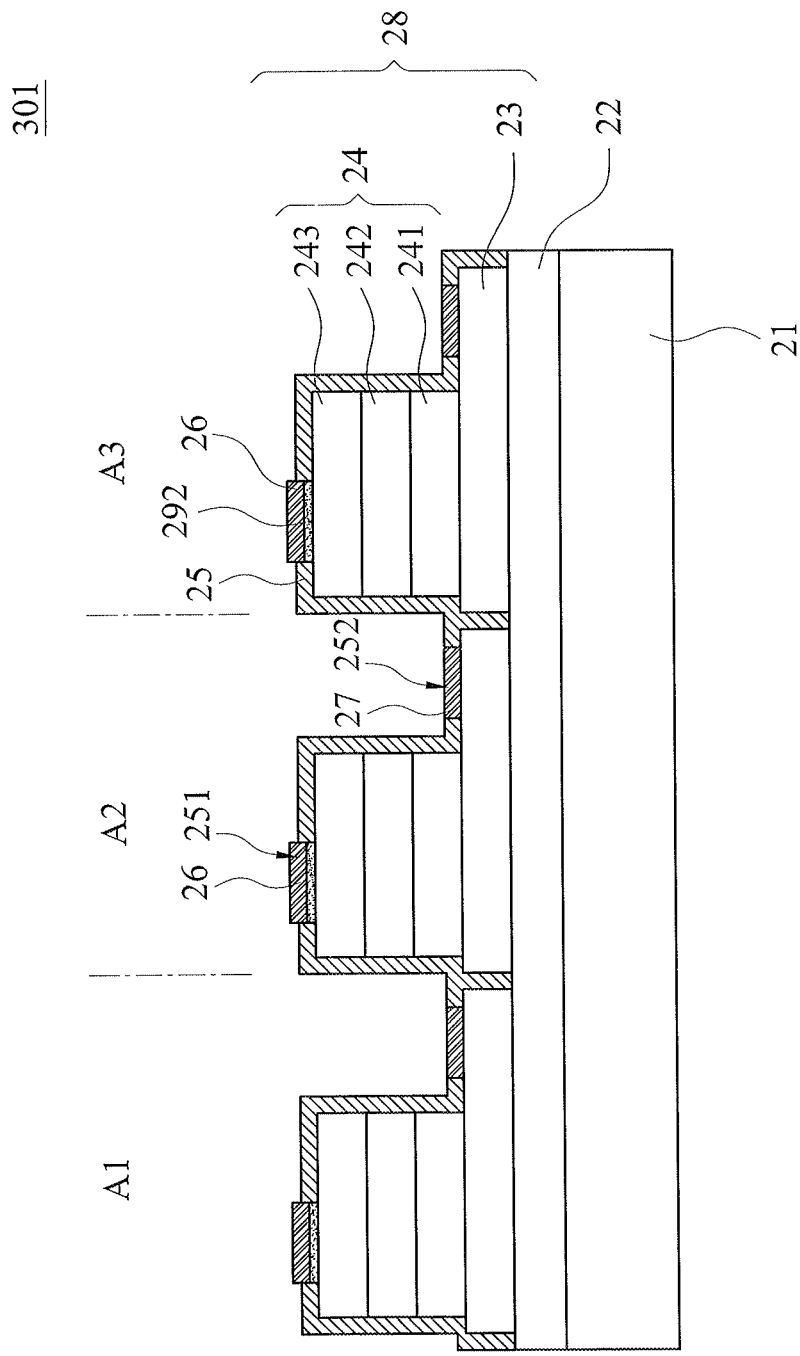
FIG. 5 is a cross-sectional view of the singulated high-voltage LED chip of FIG. 3 with a first insulating layer and electrically conductive plates.

Referring to FIG. 5, the epi-layers 24 each comprise a lower cladding layer 241, an active layer 242, and an upper cladding layer 243. Each of the lower cladding layers 241 is formed on a corresponding one of the first ohmic contact layers 23. The lower cladding layers 241 are made of p-type aluminum gallium indium phosphide (AlGaInP). The active layer 242 is formed on the lower cladding layers 241 and has a single hetero-structure (SH), a double hetero-structure (DH), or multiple quantum wells (MQW). The upper cladding layers 243 are formed on the active layers 242. The upper cladding layers 243 are made of n-type aluminum gallium indium phosphide (AlGaInP). A second ohmic contact layer 292 can also be formed between the upper cladding layer 243 and the first electrically conducting plate 26.

The first insulating layer 25 is, for example, made of silicon oxide ($SiO_2$), covers the exposed surfaces of each of the first ohmic contact layers 23 and the exposed surfaces of each of the upper cladding layers 243, and forms between any two of the first ohmic contact layers 23. The first insulating layer 25 not only insulates the light-emitting diodes 28 of different units from each other to thereby prevent them from affecting each other, but also ensures that the light-emitting diodes 28 will not be affected by ambient surroundings, such as moisture or humidity, to the detriment of their service life.

A first opening 251 and a second opening 252, which correspond in position to each of the upper cladding layers 243 and the bare portion 231 of each of the first ohmic contact layers 23, respectively, are formed in the first insulating layer 25. The first opening 251 and the second opening 252 are produced by an etching means, after the first insulating layer 25 has been produced.

The first electrically conducting plates 26 are each formed inside the first opening 251 of each unit and electrically connected to a corresponding one of the upper cladding layers 243. The second electrically conducting plates 27 are each formed inside the second opening 252 of each unit and electrically connected to a corresponding one of the first ohmic contact layers 23. Power is supplied to the epi-layers 24 via the first electrically conducting plates 26 and the second electrically conducting plates 27, such that the epi-layers 24 can emit light.

In an embodiment where the high-voltage LED chip 301 is designed to be a face-up structure, the high-voltage LED chip 301 has features as follows: the first substrate 21 is designed to be transparent; the adhering layer 22 is designed to be transparent; and a reflective layer (not shown) is formed on the second surface 212 of the first substrate 21 and adapted to reflect the light emitted from the epi-layers 24. In doing so, the efficiency of light emission of the high-voltage LED chip 301 is enhanced. Furthermore, it is also feasible that only the adhering layer 22 is transparent, whereas the reflective layer (not shown) is formed between the first substrate 21 and the adhering layer 22 to perform reflection, thereby enhancing the efficiency of light emission of the high-voltage LED chip 301.

Figure 6A:
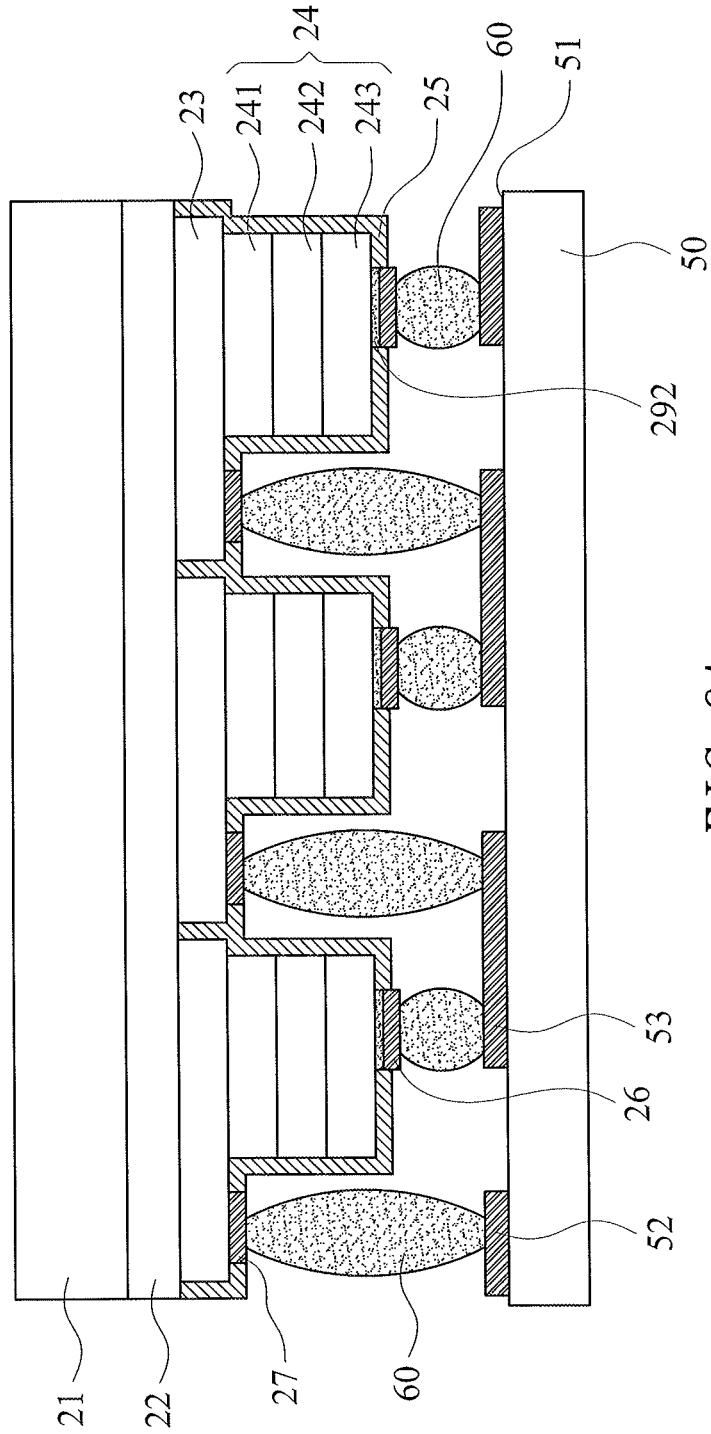
FIG. 6A is a cross-sectional view of a high-voltage LED chip further coupled to a second substrate according to an embodiment of the present invention.
Figure 6B:
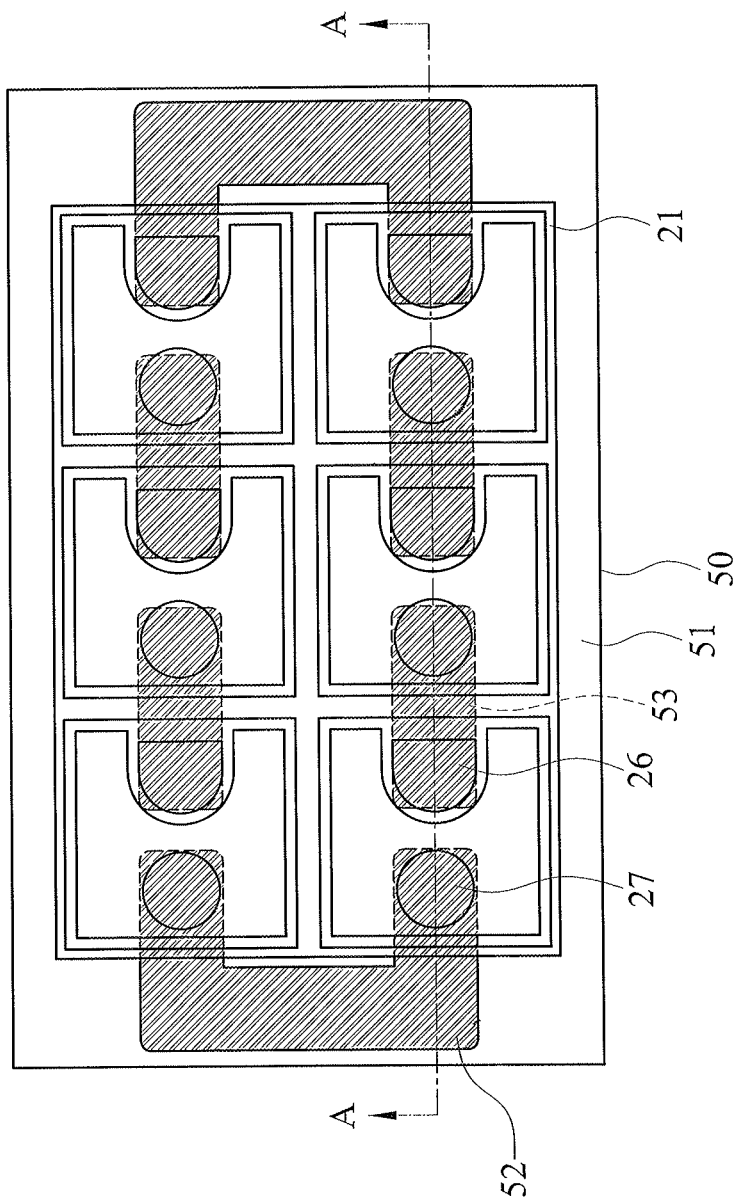
FIG. 6B is a top view of the high-voltage LED chip shown in FIG. 6A.
Figure 6C:
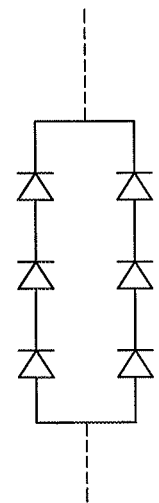
FIG. 6C is an equivalent circuit diagram of the high-voltage LED chip shown in FIG. 6A.

Referring to FIG. 6A through FIG. 6C, the high-voltage LED chip 301 further comprises a second substrate 50, so as to form a flip-chip structure. In the flip-chip structure, the first substrate 21 is transparent, and the adhering layer 22 is transparent. The second substrate 50 has at least a third surface 51. At least two third electrically conductive plates 52 and at least two fourth electrically conductive plates 53 are formed on the third surface 51. Each of the third electrically conductive plates 52 and each of the fourth electrically conductive plates 53 are electrically connected to a corresponding one of the second electrically conducting plates 27 and a corresponding one of the first electrically conducting plates 26, respectively, by a solder joint 60.

It is feasible to enlarge the third electrically conductive plates 52 and the fourth electrically conductive plates 53 directly in a manner that electrical connection is provided therebetween. Alternatively, it is feasible that a plurality of traces (not shown) is formed on the second substrate 50 for electrically connecting the third electrically conductive plates 52 to the fourth electrically conductive plates 53. The aforesaid ways of electrical connection facilitate the formation of intricate traces. The second substrate 50 is advantageously characterized in that series/parallel-connected circuits between the different light-emitting diodes 28 can be provided on the second substrate 50. The second substrate 50 can be flexibly designed in terms of its area and thickness so as to lend support to the intricate traces. Once the intricate traces are put into use, the high-voltage LED chip 301 can demonstrate diverse applicability.

The second substrate 50 is a silicon substrate, a printed circuit board (PCB), or a ceramic substrate, which is made of aluminum oxide ($Al_2O_3$), aluminum nitride (AlN), beryllium oxide (BeO), Low Temperature Cofired Ceramic (LTCC), or High Temperature Cofired Ceramic (HTCC).

Regarding the design of the flip-chip structure, to enhance the efficiency of light emission of the light-emitting diodes 28, it is feasible to form a reflective layer on the third surface 51 of the second substrate 50 in a manner that the reflective layer thus formed is positioned outside the third electrically conductive plates 52 and the fourth electrically conductive plates 53. Alternatively, it is feasible to form a reflective layer on the first insulating layer 25, or, to be specific, on an exposed surface of the first insulating layer 25.

The reflective layers are made of a material selected from aluminum (Al), silver (Ag), gold (Au), etc. Regarding the production of the reflective layers, points to note are: in an embodiment where the reflective layers are made of an electrically conductive material, the reflective layers should not come into contact with the third electrically conductive plates 52 or the fourth electrically conductive plates 53, nor should the reflective layers come into contact with the first electrically conducting plates 26 or the second electrically conducting plates 27; and, preferably, the reflective layers are separated from each of the electrically conductive plates by a specific gap for preventing a short circuit which might otherwise be formed between the electrically conductive plates.

Figure 7A:
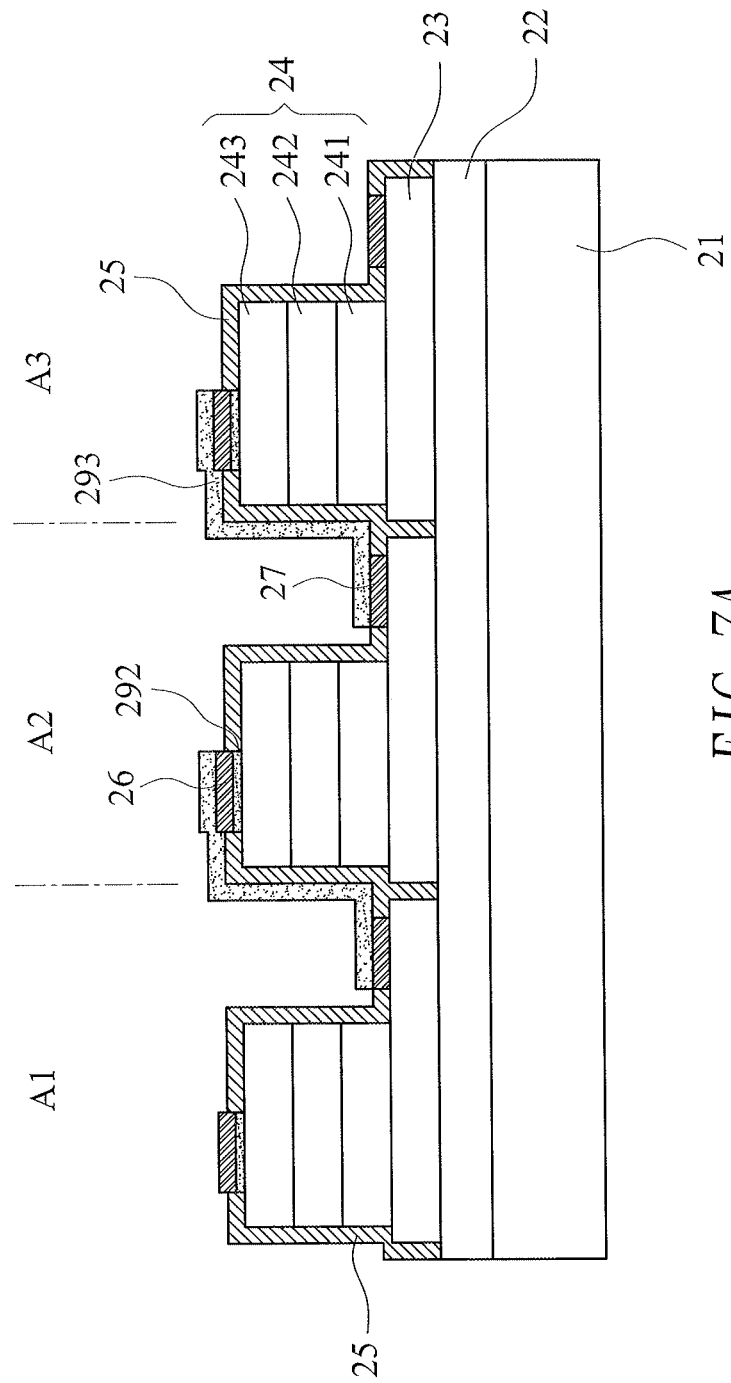
FIG. 7A is a cross-sectional view of a high-voltage LED chip further formed with a first conductor layer according to an embodiment of the present invention.
Figure 7B:
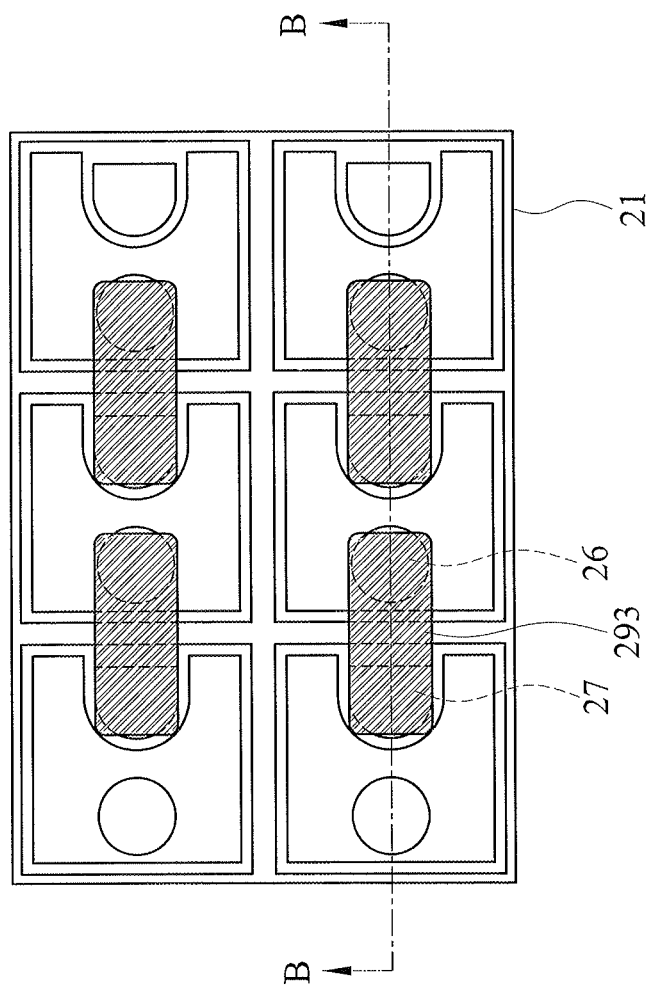
FIG. 7B is a top view of the high-voltage LED chip shown in FIG. 7A.

Referring to FIG. 7A and FIG. 7B, the high-voltage LED chip 301 further comprises a first conductor layer 293. The first conductor layer 293 has at least one conductor and covers the first insulating layer 25. The two ends of each of the conductors are electrically connected to the second electrically conducting plate 27 of one unit and the first electrically conducting plate 26 of different unit, respectively. In doing so, the light-emitting diodes 28 can be easily connected in series and/or in parallel. Being supported by the first insulating layer 25, the first conductor layer 293 is suitable for intricate circuit layout design.

Accordingly, the AC high-voltage LED chips 301 are constructed by means of inverse parallel connection of at least two said light-emitting diodes 28, and then the AC high-voltage LED chips 301 provide diverse circuit connections through the circuit substrate 200, so as to construct the high-voltage AC LED structure 100 having the AC high-voltage LED chips 301 in series connection, in parallel connection, or in parallel-series connection.

Second Embodiment of High-voltage LED Chips

Figure 8:
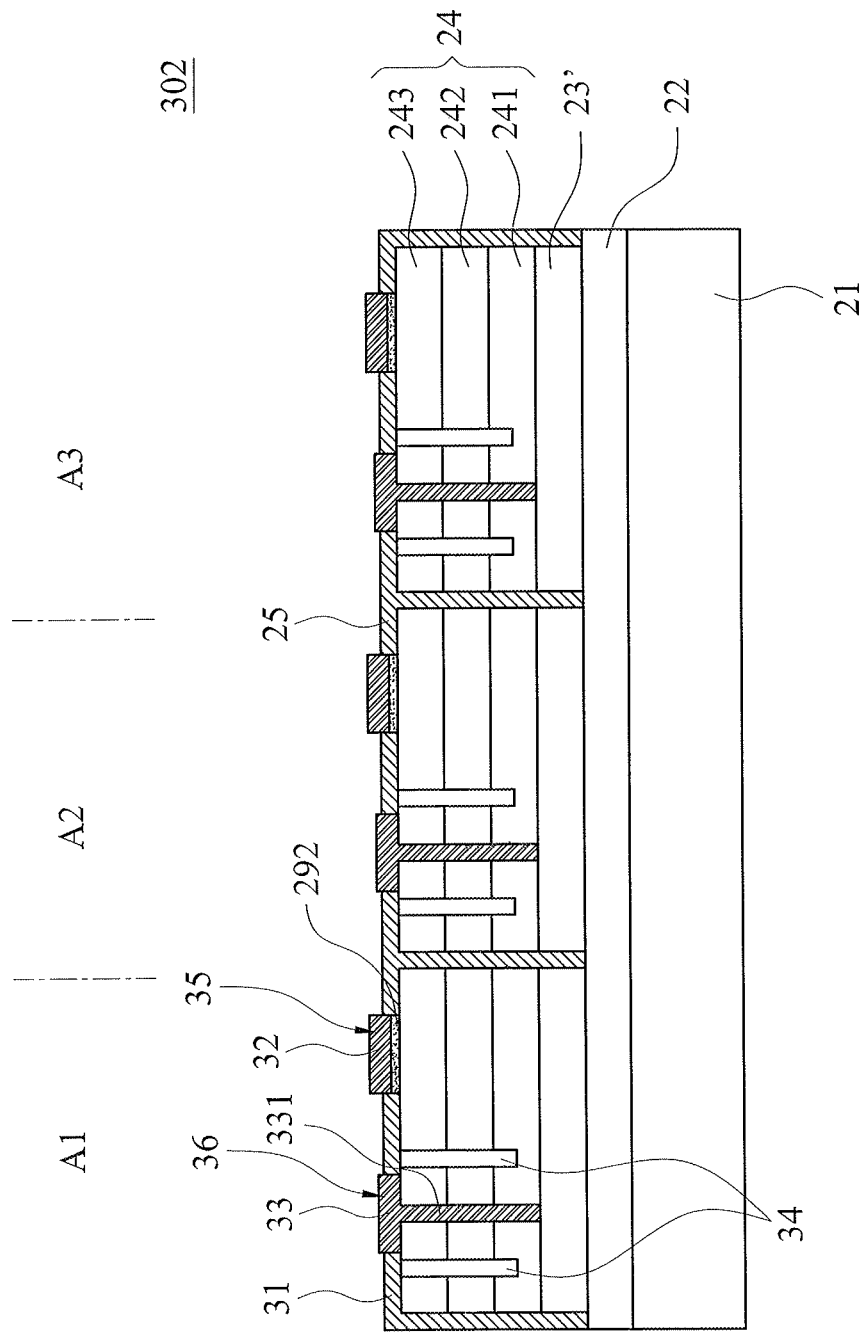
FIG. 8 is a cross-sectional view of a high-voltage LED chip which has gone through singulation, epi-layer separation, and production of a second groove according to an embodiment of the present invention.
Figure 9:
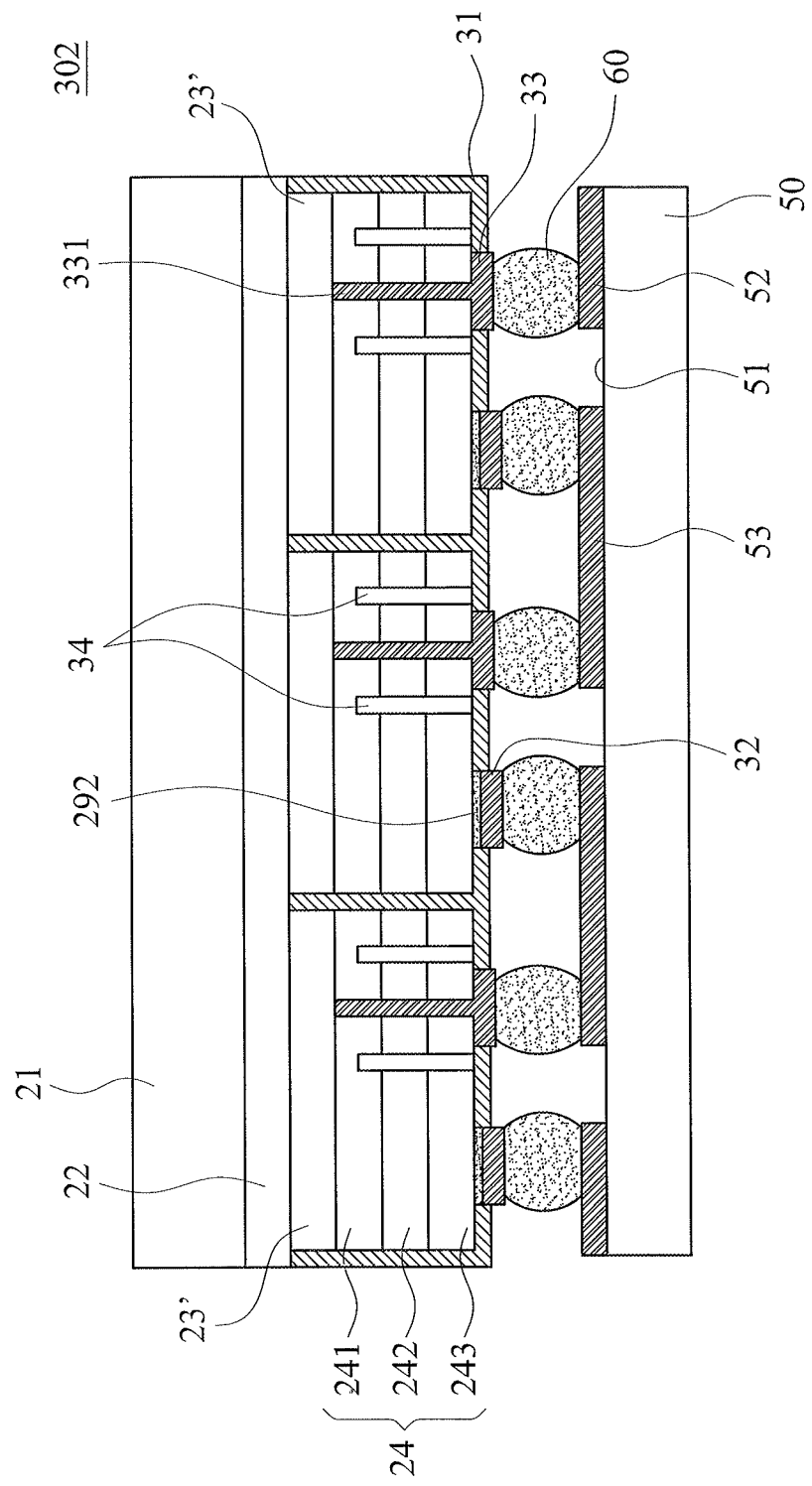
FIG. 9 is a cross-sectional view of a high-voltage LED chip further coupled to a second substrate according to an embodiment of the present invention.
Figure 10:
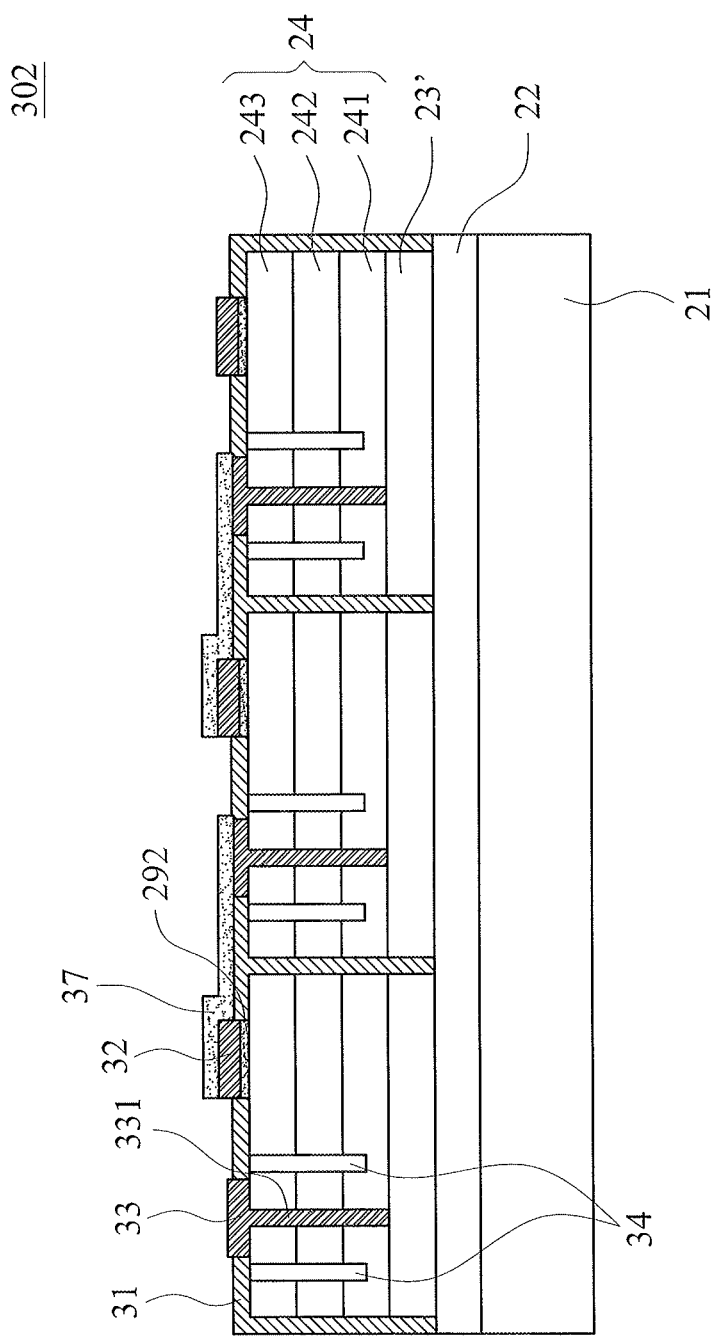
FIG. 10 is a cross-sectional view of a high-voltage LED chip further formed with a second conductor layer according to an embodiment of the present invention.
Figure 11A:
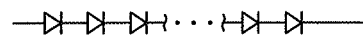
FIG. 11A through FIG. 11G are equivalent circuits of various high-voltage LED chips according to the present invention.
Figure 11B:
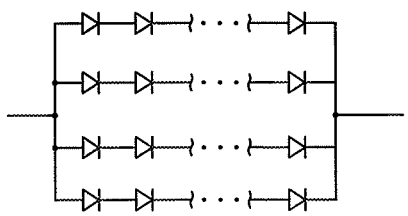
Figure 11C:
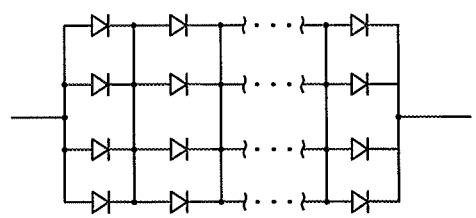
Figure 11D:
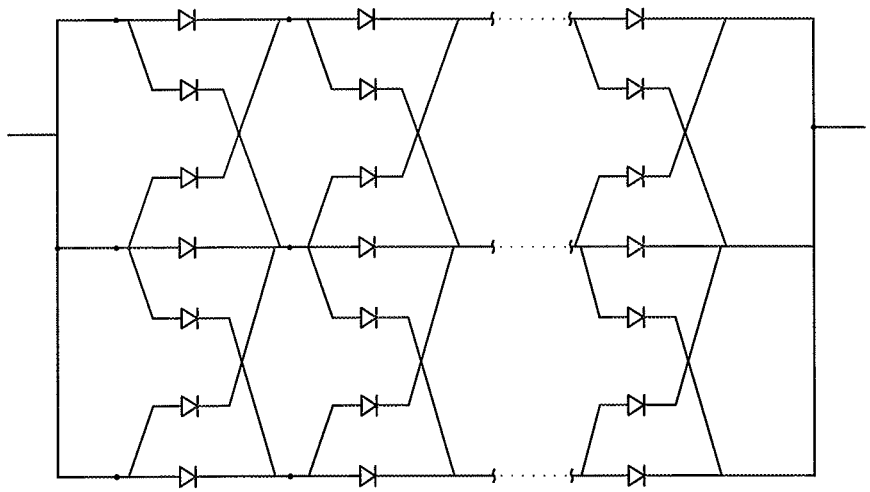
Figure 11E:
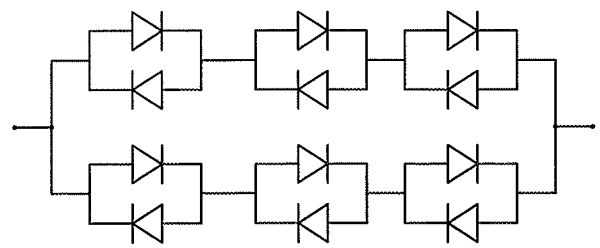
Figure 11F:
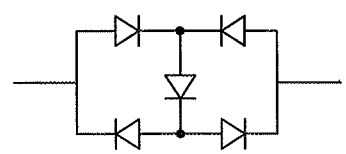
Figure 11G:
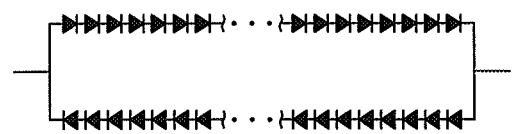

Referring to FIG. 8 through FIG. 10, in the second embodiment, a high-voltage LED chip 302 comprises a first substrate 21, an adhering layer 22, at least two first ohmic contact layers 23', at least two epi-layers 24, a second insulating layer 31, at least two fifth electrically conductive plates 32, and at least two sixth electrically conductive plates 33.

Regarding the high-voltage LED chip 302 in the second embodiment, the first substrate 21 coated with the adhering layer 22 and the preprocessing light-emitting diodes 28 formed on a wafer are coupled together in a way similar to the first embodiment, and then the temporary substrate and the etch stop layer are removed by etching, so as to obtain the high-voltage LED chip which has not yet undergone singulation.

The first substrate 21 has a first surface 211 and a second surface 212. The first substrate 21 serves mainly to underpin the high-voltage LED chip 302 in its entirety. The first substrate 21 is monocrystalline, polycrystalline, or amorphous, and is made of glass, sapphire, silicon carbide, gallium phosphide, gallium arsenide phosphide, zinc selenide, zinc sulfide, or americium sulfur selenide. The first substrate 21 can be transparent or opaque, depending on the direction of light emission of the high-voltage LED chip 302 or the design of a reflective layer. In an embodiment where guided bidirectional (upward/downward) light emission is required, the first substrate 21 has to be transparent.

The adhering layer 22 is formed on the first surface 211 and adapted to couple the first substrate 21 and the first ohmic contact layers 23' together. The adhering layer 22 is made of a material selected from B-staged benzocyclobutene (BCB), an epoxy, a silicone, polymethyl methacry (PMMA), a polymer, and a spin-on glass (SOG). The adhering layer 22 can be transparent or opaque, depending on the direction of light emission of the high-voltage LED chip 302 or the design of a reflective layer. In an embodiment where guided bidirectional (upward/downward) light emission is required, the adhering layer 22 has to be transparent.

Referring to FIG. 8, in the second embodiment, the first substrate 21 and the adhering layer 22 are shared by and between the high-voltage LED chips 302. Hence, singulation is performed on the first ohmic contact layers 23' and the epi-layers 24 only, so as to form units A1, A2, A3 . . . etc.

The first ohmic contact layers 23' is formed on the adhering layer 22. The first ohmic contact layers 23', which can be a p-type ohmic contact layer, is formed on a wafer initially and partitioned by an etching means to form different units.

The epi-layer 24, which is a single light-emitting diode, is partitioned by etching to form different units. The epi-layers 24 each comprise a lower cladding layer 241, an active layer 242, an upper cladding layer 243, and a second groove 34.

Each of the lower cladding layers 241 is formed on a corresponding one of the first ohmic contact layers 23'. The lower cladding layers 241 are made of p-type aluminum gallium indium phosphide (AlGaInP). The active layer 242 is formed on the lower cladding layers 241 and has a single hetero-structure (SH), a double hetero-structure (DH), or multiple quantum wells (MQW). The upper cladding layers 243 are formed on the active layer 242. The upper cladding layers 243 are made of n-type aluminum gallium indium phosphide (AlGaInP).

A second groove 34 is formed by an etching means to penetrate the upper cladding layers 243 and the active layer 242 perpendicularly and penetrate the lower cladding layers 241 partially. The second groove 34 provide a space required for electrical insulation between a flanking portion of the active layer 242 and a flanking portion of the upper cladding layers 243. To render the manufacturing process easy, the second groove 34 can be formed at the periphery of the sixth electrically conductive plates 33 to enable efficient electrical insulation of the active layer 242, such that an extension portion 331 of the sixth electrically conductive plates 33 can transmit electric power to the first ohmic contact layers 23' smoothly. To render subsequent processes easy, it is feasible to perform the production of the second insulating layer 31 and a process of filling the second groove 34 with the second insulating layer 31 simultaneously.

The second insulating layer 31 is, for example, made of silicon oxide (SiO$_2$), covers the exposed surfaces of each of the upper cladding layers 243, and forms between any two of the epi-layers 24 and any two of the first ohmic contact layers 23'. The second insulating layer 31 not only insulates the light-emitting diodes of different units from each other to thereby prevent them from affecting each other, but also ensures that the light-emitting diodes will not be affected by ambient surroundings, such as moisture or humidity, to the detriment of their service life. A third opening 35 and a fourth opening 36, which correspond in position to each of the upper cladding layers 243 and the inner side of the second groove 34, respectively, are formed in the second insulating layer 31. The third opening 35 and the fourth opening 36 are produced by an etching means, after the second insulating layer 31 has been produced.

The fifth electrically conductive plate 32 is formed inside each of the third openings 35 and electrically connected to a corresponding one of the upper cladding layers 243. A second ohmic contact layer 292 is formed between the upper cladding layer 243 and the fifth electrically conductive plate 32. The sixth electrically conductive plate 33 is formed inside each of the fourth openings 36 and has an extension portion 331 extending downward. The extension portion 331 penetrates the epi-layers 24 perpendicularly and is electrically connected to a corresponding one of the first ohmic contact layers 23'. Power is supplied to the epi-layers 24 via the fifth electrically conductive plates 32 and the sixth electrically conductive plates 33, such that the epi-layers 24 can emit light.

In an embodiment where the high-voltage LED chip 302 is designed to be a face-up structure, both the first substrate 21 and the adhering layer 22 are designed to be transparent, and a reflective layer is formed on the second surface 212 of the first substrate 21 and adapted to reflect the light emitted from the epi-layers 24. In doing so, the efficiency of light emission of the high-voltage LED chip 302 is enhanced. Alternatively, it is feasible that only the adhering layer 22 is designed to be transparent, whereas the reflective layer is formed between the first substrate 21 and the adhering layer 22 to perform reflection, thereby enhancing the efficiency of light emission of the high-voltage LED chip 302.

Referring to FIG. 9, the high-voltage LED chip 302 further comprises a second substrate 50, so as to form a flip-chip structure. In the flip-chip structure, both the first substrate 21 and the adhering layer 22 are transparent. The second substrate 50 has at least a third surface 51. At least two said third electrically conductive plates 52 and at least two fourth electrically conductive plates 53 are formed on the third surface 51. Each of the third electrically conductive plates 52 and each of the fourth electrically conductive plates 53 are electrically connected to a corresponding one of the sixth electrically conductive plates 33 and a corresponding one of the fifth electrically conductive plates 32, respectively, by the solder joint 60.

It is feasible to enlarge the third electrically conductive plates 52 and the fourth electrically conductive plates 53 directly in a manner that electrical connection is provided therebetween. Alternatively, it is feasible that a plurality of traces (not shown) is formed on the second substrate 50 for electrically connecting the third electrically conductive plates 52 to the fourth electrically conductive plates 53. The aforesaid ways of electrical connection facilitate the formation of intricate traces. The second substrate 50 is advantageously characterized in that series/parallel-connected circuits between the different light-emitting diodes can be provided on the second substrate 50. The second substrate 50 can be flexibly designed in terms of its area and thickness so as to lend support to the intricate traces. Once the intricate traces are put into use, the high-voltage LED chip 302 can demonstrate diverse applicability.

The second substrate 50 is a silicon substrate, a printed circuit board (PCB), or a ceramic substrate, which is made of aluminum oxide, aluminum nitride, beryllium oxide, Low Temperature Cofired Ceramic (LTCC), or High Temperature Cofired Ceramic (HTCC).

Regarding the design of the flip-chip structure, to enhance the efficiency of light emission of the light-emitting diodes, it is feasible to form a reflective layer on the third surface 51 of the second substrate 50 in a manner that the reflective layer thus formed is positioned outside the third electrically conductive plates 52 and the fourth electrically conductive plates 53. Alternatively, it is feasible to form a reflective layer on the second insulating layer 31, or, to be specific, on an exposed surface of the second insulating layer 31.

The reflective layers are made of a material selected from aluminum, silver, gold, etc. Regarding the production of the reflective layers, points to note are: in an embodiment where the reflective layers are made of an electrically conductive material, the reflective layers should not come into contact with the third electrically conductive plates 52 or the fourth electrically conductive plates 53, nor should the reflective layers come into contact with the fifth electrically conductive plates 32 or the sixth electrically conductive plates 33; and, preferably, the reflective layers are separated from each of the electrically conductive plates by a specific gap for preventing a short circuit which might otherwise be formed between the electrically conductive plates.

To enhance the ease of connection between the light-emitting diodes of the high-voltage LED chip 302, ensure the high-voltage LED chip 302 and the second substrate 50 are coupled together evenly and completely, and facilitate the implementation of the manufacturing process, all the surfaces of the fifth electrically conductive plates 32 and sixth electrically conductive plates 33 are of the same height.

Referring to FIG. 10, the high-voltage LED chip 302 further comprises a second conductor layer 37. The second conductor layer 37 has at least one conductor and covers the second insulating layer 31. The two ends of each of the conductors are electrically connected to the fifth electrically conductive plate 32 of one unit and the sixth electrically conductive plate 33 of the other unit, respectively. In doing so, the light-emitting diodes can be easily connected in series and/or in parallel. Being supported by the second insulating layer 31, the second conductor layer 37 is suitable for intricate circuit layout design.

Referring to FIG. 11A through FIG. 11G, in this embodiment, the first insulating layer 25 and the second insulating layer 31 of the high-voltage LED chip 302 are complete, and thus identical or similar intricate circuits can be produced on the insulating layers. In particular, it is easy to attain a related circuit, when a flip-chip structure is formed from the second substrate 50.

In an embodiment where the AC high-voltage LED chips 302 are constructed by means of inverse parallel connection of at least two said light-emitting diodes, and then the AC, high-voltage LED chips 302 provide diverse circuit connections through the circuit substrate 200, so as to construct the high-voltage AC LED structure 100 having the AC high-voltage LED chips 302 in series connection, in parallel connection, or in parallel-series connection.

Furthermore, in an embodiment where the high-voltage LED chips 301, 302 are direct current (DC) high-voltage LED chips, the DC high-voltage LED chips 301, 302 provide diverse circuit connections through the circuit substrate 200, so as to construct the high-voltage AC LED structure 100 having at least two said DC high-voltage LED chips 301, 302 connected in parallel and inversely. In this regard, the high-voltage AC LED structure 100 comprising the high-voltage LED chips 301, 302 connected by means of the circuit substrate 200 can come in any form, and thus the way of connecting the high-voltage LED chips 301, 302 is not described hereunder for the sake of brevity.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of the present invention. Hence, all equivalent modifications or amendments made to the aforesaid embodiment should fall within the scope of the appended claims.

What is claimed is:

1. A high-voltage alternating current (AC) light-emitting diode (LED) structure, comprising:
   a circuit substrate; and
   a plurality of high-voltage LED chips fixed to and electrically connected to the circuit substrate and forming a series-connected circuit by means of the circuit substrate, the high-voltage LED chips each comprising:
      a first substrate having a first surface and a second surface;
      an adhering layer formed on the first surface;
      at least two first ohmic contact layers formed on the adhering layer;
      at least two epi-layers having a first groove formed between any two adjacent said epi-layers, the epi-layers each comprising: a lower cladding layer formed on a corresponding one of the first ohmic contact layers; an active layer formed on the lower cladding layers; and an upper cladding layer formed on the active layer;
      a first insulating layer covering exposed surfaces of each of the first ohmic contact layers and exposed surfaces of each of the upper cladding layers, and forming between any two of the first ohmic contact layers, wherein a first opening and a second opening corresponding in position to each of the upper cladding layers and a bare portion of each of the first ohmic contact layers, respectively, are formed in the first insulating layer;
      at least two first electrically conducting plates each formed inside a corresponding one of the first openings and electrically connected to a corresponding one of the upper cladding layers;
      at least two second electrically conducting plates each formed inside a corresponding one of the second openings and electrically connected to a corresponding one of the first ohmic contact layers; and
      a second substrate having a third surface, wherein at least two third electrically conductive plates and at least two fourth electrically conductive plates are formed on the third surface; the second substrate having a plurality of traces formed thereon for electrically connecting the third electrically conductive plates and the fourth electrically conductive plates, wherein each of the third electrically conductive plates and each of the fourth electrically conductive plates are electrically connected to a corresponding one of the second electrically conducting plates and/or a corresponding one of the first electrically conducting plates, respectively, by a solder joint, the first substrate being transparent, the adhering layer being transparent, and wherein a reflective layer is formed on the third surface in a manner that the reflective layer thus formed is positioned outside the third electrically conductive plates and the fourth electrically conductive plates.

2. The high-voltage AC LED structure of claim 1, wherein the circuit substrate is an aluminum substrate or a ceramic substrate.

3. The high-voltage AC LED structure of claim 2, wherein a plurality of thermally conductive posts or a plurality of electrically conductive posts is disposed in the ceramic substrate.

4. The high-voltage AC LED structure of claim 1, wherein any two of the high-voltage LED chips are connected in parallel, such that the series-connected circuit further has a parallel-connected circuit.

5. The high-voltage AC LED structure of claim 1, wherein the series-connected circuit is further parallel-connected with at least one series-connected circuit.

6. The high-voltage AC LED structure of claim 1, further comprising a first conductor layer having at least one conductor and covering the first insulating layer, the conductors each having two ends electrically connected to the second electrically conducting plates and the first electrically conducting plates of different units, respectively.

7. A high-voltage alternating current (AC) light-emitting diode (LED) structure, comprising:
   a circuit substrate; and
   a plurality of high-voltage LED chips fixed to and electrically connected to the circuit substrate and forming a series-connected circuit by means of the circuit substrate, the high-voltage LED chips each comprising:

a first substrate having a first surface and a second surface;
an adhering layer formed on the first surface;
at least two first ohmic contact layers formed on the adhering layer;
at least two epi-layers each comprising: a lower cladding layer formed on a corresponding one of the first ohmic contact layers; an active layer formed on the lower cladding layers; an upper cladding layer formed on the active layer; and a second groove penetrating the upper cladding layers and the active layer perpendicularly and penetrating the lower cladding layers partially;
a second insulating layer covering each of the upper cladding layers and forming between any two of the epi-layers and any two of the first ohmic contact layers, wherein a third opening and a fourth opening corresponding in position to each of the upper cladding layers and an inner side of the second groove, respectively, are formed in the second insulating layer;
at least two fifth electrically conductive plates formed in each of the third openings, respectively, and electrically connected to the upper cladding layers; and
at least two sixth electrically conductive plates formed in each of the fourth openings, respectively, and having an extension portion extending downward, the extension portion penetrating the epi-layers perpendicularly and being electrically connected to the first ohmic contact layers.

8. The high-voltage AC LED structure of claim 7, wherein the circuit substrate is an aluminum substrate or a ceramic substrate.

9. The high-voltage AC LED structure of claim 8, wherein a plurality of thermally conductive posts or a plurality of electrically conductive posts is disposed inside the ceramic substrate.

10. The high-voltage AC LED structure of claim 7, wherein any two of the high-voltage LED chips are connected in parallel, such that the series-connected circuit further has a parallel-connected circuit.

11. The high-voltage AC LED structure of claim 7, wherein the series-connected circuit is further parallel-connected with at least one series-connected circuit.

12. The high-voltage AC LED structure of claim 7, wherein the second insulating layer is formed in the second groove.

13. The high-voltage AC LED structure of claim 7, wherein both the first substrate and the adhering layer are transparent, and a reflective layer is formed on the second surface.

14. The high-voltage AC LED structure of claim 7, wherein the adhering layer is transparent, and a reflective layer is formed between the first substrate and the adhering layer.

15. The high-voltage AC LED structure of claim 7, further comprising a second substrate having a third surface, wherein at least two third electrically conductive plates and at least two fourth electrically conductive plates are formed on the third surface, the second substrate having a plurality of traces formed thereon for electrically connecting the third electrically conductive plates and the fourth electrically conductive plates, wherein each of the third electrically conductive plates and each of the fourth electrically conductive plates are electrically connected to a corresponding one of the sixth electrically conductive plates and/or a corresponding one of the fifth electrically conductive plates, respectively, by a solder joint, the first substrate being transparent, and the adhering layer being transparent.

16. The high-voltage AC LED structure of claim 15, wherein a reflective layer is formed on the second substrate in a manner that the reflective layer thus formed is positioned outside the third electrically conductive plates and the fourth electrically conductive plates.

17. The high-voltage AC LED structure of claim 15, wherein a reflective layer is formed on the second insulating layer.

18. The high-voltage AC LED structure of claim 7, wherein surfaces of the fifth electrically conductive plates and sixth electrically conductive plates are of a same height.

19. The high-voltage AC LED structure of claim 7, further comprising a second conductor layer having at least one conductor and covering the second insulating layer, the conductors each having two ends electrically connected to the fifth electrically conducting plates and the sixth electrically conducting plates of different units, respectively.

* * * * *